United States Patent
Furuyama

(10) Patent No.: US 7,153,361 B2
(45) Date of Patent: Dec. 26, 2006

(54) PRODUCTION METHOD OF OPTO-ELECTRONIC DEVICE ARRAY

(75) Inventor: Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 400 days.

(21) Appl. No.: 10/743,087

(22) Filed: Dec. 23, 2003

(65) Prior Publication Data

US 2004/0134416 A1    Jul. 15, 2004

(30) Foreign Application Priority Data

Dec. 24, 2002    (JP)    ............... 2002-372903

(51) Int. Cl.
*C30B 25/12*    (2006.01)
*C30B 25/14*    (2006.01)

(52) U.S. Cl. ............... 117/84; 117/85; 117/87; 117/88; 117/89; 117/102

(58) Field of Classification Search ............... 117/84, 117/88, 89, 82, 85, 87, 102
See application file for complete search history.

(56) References Cited

FOREIGN PATENT DOCUMENTS

JP    11-307878    11/1999

OTHER PUBLICATIONS

Eli Yablonovitch, et al., "Extreme selectivity in the lift-off of epitaxial GaAs films", Applied Physics Letters, vol. 51, No. 26, Dec. 28, 1987, pp. 2222-2224.

Nan M. Jokerst, et al., "Microsystem Optoelectronic Integration for Mixed Multisignal Systems", IEEE Journal on Selected Topics in Quantum Electronics, vol. 6, No. 6, Nov./Dec. 2000, pp. 1231-1239.

*Primary Examiner*—Felisa Hiteshew
(74) *Attorney, Agent, or Firm*—Oblon, Spivak, McClelland, Maier & Neustadt, P.C.

(57) ABSTRACT

An opto-electronic device array is made from a multilayer epitaxial film by the following steps. The multilayer epitaxial film is separated into a plurality of segments. The segments are transferred to a first substrate to be arranged in an array substantially. Active regions are respectively confined in the segments so that the active regions form the array.

30 Claims, 13 Drawing Sheets

PRODUCTION METHOD OF OPTO-ELECTRONIC DEVICE ARRAY

CROSS-REFERENCE TO RELATED APPLICATIONS

This application is based upon and claims the benefit of priority from the prior Japanese Patent Application No. 2002-372903 (filed on Dec. 24, 2002); the entire contents of which are incorporated herein by reference.

BACKGROUND OF THE INVENTION

1. Field of the Invention

The present invention relates to a method for producing an opto-electronic device array.

2. Description of the Related Art

In these days, large-scale integrated circuits (LSIs) are remarkably getting higher working speed due to improved performance of electronic devices such as bipolar transistors or field effect transistors. Compared with LSIs, printed-circuit boards, on which LSIs are mounted, generally have a lower working speed and even less so for racks including a plurality of such printed-circuit boards. This is resulted from differences of the respective basic clocks thereof. In a case of relatively long wiring, the basic clock is necessary to be suppressed so as to prevent transmission loss, noise influence and electromagnetic failure because the long wiring is susceptible thereto. Therefore, even if working speed of the LSIs is increased, performance of a system of the LSIs cannot be improved as much as expected. Wiring arts, in other words, packaging arts, are getting of greater importance compared with an art of improving the LSIs' working speed.

In view of the above problem concerning with the wiring arts, there are proposed some optical wiring devices for wiring among plural LSIs. Optical wiring devices are characterized by hardly having frequency dependency in transmission loss ranging from direct current (DC) up to several tens of giga-hertz (GHz). The optical wiring devices can easily achieve a transfer rate up to several tens Gbps because of not having electromagnetic failure and noise influence caused by earth potential change. The optical wiring devices are expected to provide high-speed transmission for interconnection between LSIs, therefore research and development is urgently progressed. To realize such optical wiring devices, an opto-electronic device array is required, in which several tens or hundreds of opto-electronic devices are disposed in even pitches so as to establish corresponding numbers of optical links.

However, the optical wiring devices have a problem of a production cost compared with conventional electrical wiring. The main reason is that the optical wiring devices are made of compound semiconductors such as GaAs or InP, which have higher material cost and higher production cost than Si. Si has an advantage in cost, however, light emitting devices of Si have extremely low light emission efficiency because Si is an indirect gap semiconductor. Especially, in a field of high-speed light emitting devices, there are no practical devices other than compound semiconductors. In this stage, there are no alternatives than applying compound semiconductors to such light emitting devices. Cost reduction is necessary to put the optical wiring arts into practical use.

An approach to reduce the cost for production of the opto-electronic device array is to improve efficiency of utilizing material thereof. For example, a semiconductor laser for compact discs (CD) has a device area of 300 μm×300 μm, however, an area no more than 10 μm×300 μm is employed as an active region for laser emission and rest of the device area is utilized for handling of the device and aid of heat radiation. In this example, provided that the rest were omitted, thirty devices could be formed in the area of 300 μm×300 μm in theory. In a case of vertical cavity surface emitting laser-diodes (VCSEL hereinafter), which become in practical use in recent years, each of active regions thereof has an area of about 10 μm×10 μm, therefore nine hundreds devices could be formed in the area of 300 μm×300 μm in theory.

Even though the theoretical consideration is extreme, current arts of production of opto-electronic devices made from compound semiconductors leave much to improve in view of efficiency of utilizing material. An approach to improve the efficiency is an art of so-called epitaxial lift-off (ELO hereinafter). A related art is disclosed in IEEE Journal on Selected Topics in Quantum Electronics Vol. 6, No. 6, p. 1231–1239. According to the epitaxial lift-off arts, a semiconductor structure is formed on a first substrate and transferred therefrom to a second substrate. Thereby the semiconductor structure can be employed on the second substrate.

SUMMARY OF THE INVENTION

According to a first aspect of the present invention, a production method of an array of opto-electronic devices from a multilayer epitaxial film is provided with separating the multilayer epitaxial film into a plurality of segments, transferring the segments to a first substrate and confining active regions in the respective segments on the first substrate so that the active regions form the array.

According to a second aspect of the present invention, a production method of an array of opto-electronic devices from a multilayer epitaxial film is provided with separating the multilayer epitaxial film into a plurality of segments, transferring the segments to a first substrate and implanting ions into the respective segments on the first substrate so as to confine active regions enclosed in areas to which the ions are implanted so that the active regions form the array.

According to a third aspect of the present invention, a production method of an array of opto-electronic devices from a multilayer epitaxial film is provided with separating the multilayer epitaxial film into a plurality of segments, transferring the segments to a first substrate and confining active regions in the respective segments on the first substrate so that the active regions form the array.

BRIEF DESCRIPTION OF THE FIGURES

Several embodiments of the present invention will be described by referring to the figures and the following detailed description. In the following figures, the same reference numerals denote substantially the same elements and similar reference numerals denote similar elements as between the various figures. The figures are not to scale and proportions of elements are not precise.

DETAILED DESCRIPTION OF THE INVENTION

Several embodiments of the present invention will be described with reference to the figures. In the following description, these recited ranges and these recited materials are to be treated as exemplary. In addition, the figures are not drawn to scale for ease of understanding of the present invention.

A first embodiment of the present invention will be described hereinafter with reference to FIGS. 1–8.

Figure 1A:
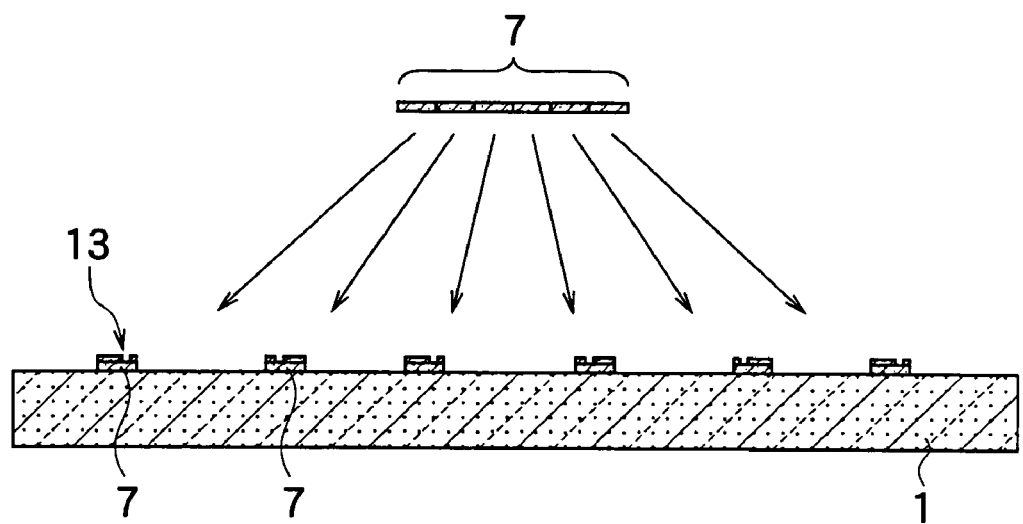
FIG. 1A is a schematic illustration of a side view of an opto-electronic device array according to a first embodiment of the present invention.
Figure 1B:
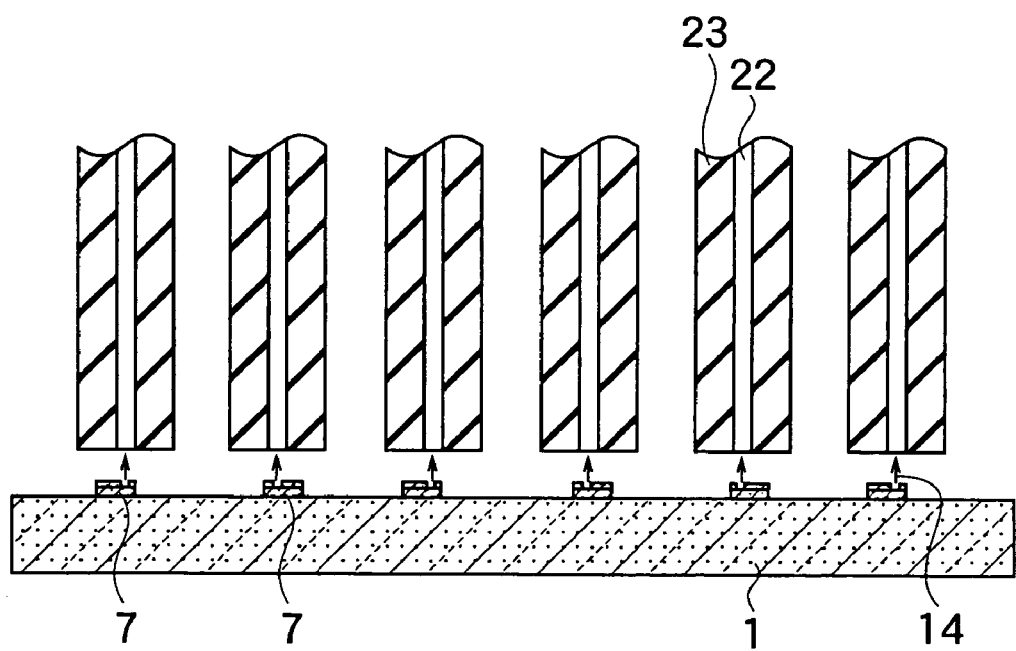
FIG. 1B is a schematic illustration of a side view of the opto-electronic device array and optical fibers linked thereto.
Figure 2:
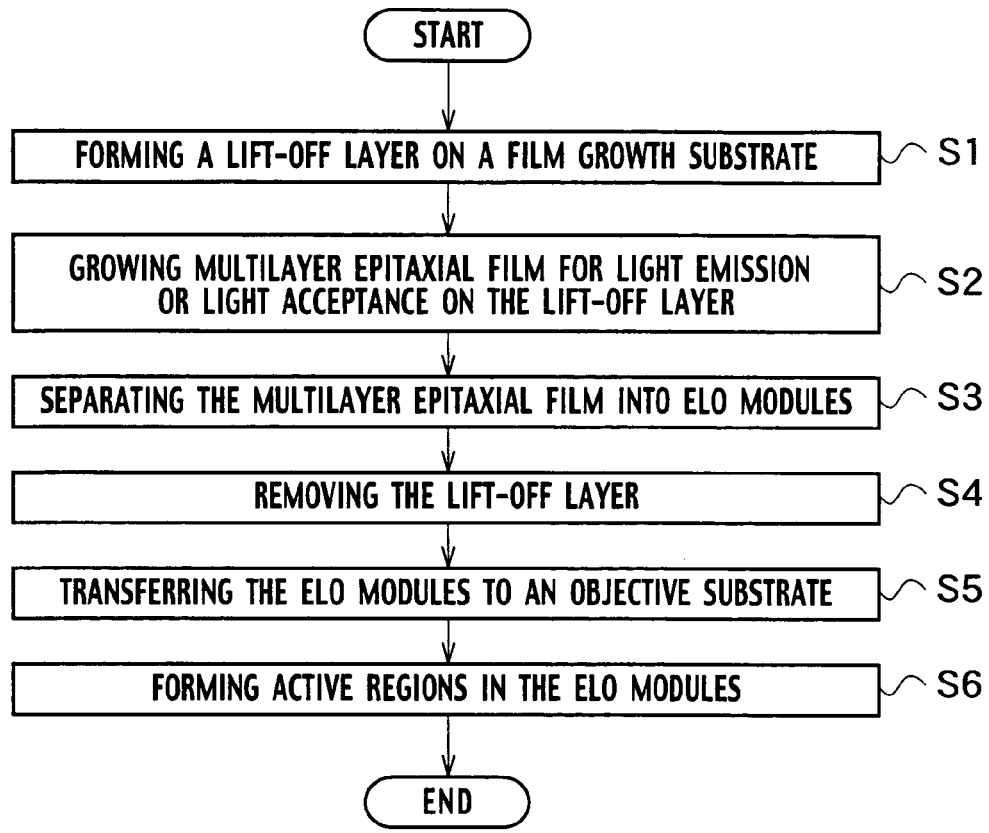
FIG. 2 is a flow chart showing a production process of the opto-electronic device array according to the first embodiment of the present invention.

A production method is generally shown in FIG. 2. At a first step S1, a lift-off layer 17 is formed on the film growth substrate 34 which is made of a compound semiconductor such as GaAs for example. At a second step S2, epitaxial films 4, 5, 6 for light emission or light acceptance are grown on the lift-off layer 17. At a third step S3, partition grooves 18 are formed on the epitaxial films 4, 5, 6 deep enough to reach the lift-off layer 17 so that the epitaxial films 4, 5, 6 are separated into a plurality of ELO segments 7. Each of the ELO segments 7 has an area required for forming an opto-electronic device including a marginal area required for tolerance of an arrangement error, which following steps may cause. At a fourth step S4, the lift-off layer 17 is removed. At a fifth step S5, the ELO segments 7 are transferred to an objective substrate 1. At a sixth step S6, active regions 13 as opto-electronic devices are respectively formed in the ELO segments 7 by means of a photolithography method and such. At this time, the active regions 13 of the opto-electronic device can be accurately formed at even intervals even if transfer of the ELO segments 7 includes errors. More specifically, the errors accompanying transfer of the ELO segments 7 can be tolerated by means of the aforementioned marginal area so that the active regions 13 can be accurately coupled with the optical fibers, as shown in FIG. 1B, according to the production method of the first embodiment.

A feature of the present invention compared with prior arts can be briefly described as follows. Though arrangement of the ELO segments 7 on the objective substrate 1 may be scattered to some extent, the active regions 13 in the respective ELO segments 7 can be accurately arranged so as to form an array. Because each of the ELO segments 7 must have a marginal area required for tolerance of an arrangement error as mentioned above. The first embodiment of the present invention appears to require a larger area of the epitaxial films compared with the prior arts, however, the marginal areas of the present embodiment correspond to areas of the electrode pads of the prior arts and additional areas are not necessary in substance. In other words, the prior arts further require additional marginal areas required for tolerance of errors caused by inversion of the ELO segments, therefore the first embodiment of the present invention requires smaller area of the epitaxial films compared with the prior arts.

As mentioned above, according to the first embodiment of the present invention, even when transfer cannot be accurately done, the respective active regions of the opto-electronic array can be accurately disposed because the active regions are formed after the transfer. Further, efficiency of utilizing material can be improved compared with the prior arts. Therefore reduction of production cost as well as the high accuracy of the opto-electronic array arrangement is obtained.

Figure 3:
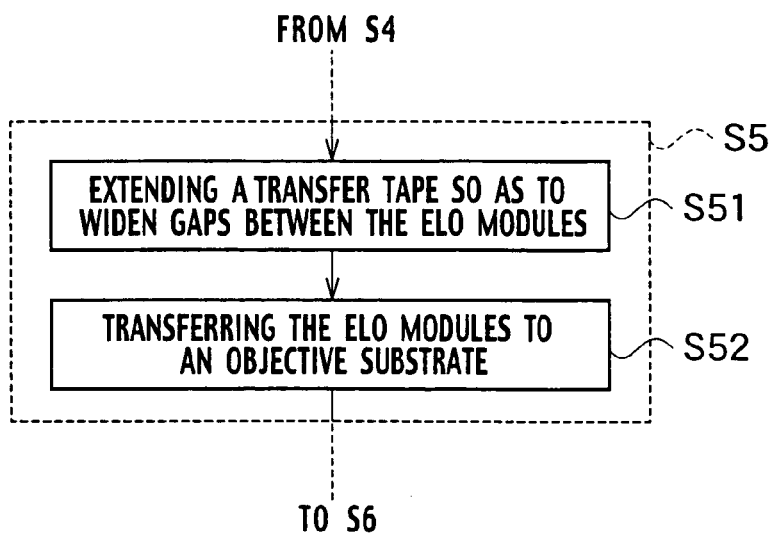
FIG. 3 is a flow chart of the S5 step of the flow chart shown in FIG. 2 described in detail.

Furthermore, the step S5 is preferably done as shown in FIG. 3. A plurality of ELO segments 7 are adhered on a transfer tape. After removing the lift-off layer 17, the transfer tape is extended so that pitches between the ELO segments 7 are widened at a step S51. The separated ELO segments 7 having wider pitches are transferred to the objective substrate 1 at a step S52.

An example according to the first embodiment of the present invention will be described hereinafter based on a more specific structure of an opto-electronic device array. In the example, AlGaAs/GaAs alloy system is exemplified, however, the present invention can be achieved with the other systems such as GaInAsP/InP, GaInNAs/GaAs, GaInN/GaN, organic semiconductor and the like.

FIGS. 4A–4C and 6A–6C are sectional views showing production method of an opto-electronic device array according to the first embodiment of the present invention. In the figures, a reference numeral 34 denotes a second substrate ("growth substrate of GaAs" hereinafter), a reference numeral 17 denotes a lift-off layer of AlAs (having a thickness of 2 µm), a reference numeral 4 denotes an n-type DBR having forty pairs of quarter-wavelength thick alternating layers of n-type-$Al_{0.2}Ga_{0.8}As$/n-type-$Al_{0.9}Ga_{0.1}As$, a reference numeral 5 denotes a GaAs quantum well active layer (three layers of 8 nm and two layers of 10 nm of $Al_{0.2}Ga_{0.8}As$ barrier layers) and a reference numeral 6 denotes a p-type DBR having thirty pairs of quarter-wavelength thick alternating layers of p-type-$Al_{0.2}Ga_{0.8}As$/p-type-$Al_{0.9}Ga_{0.1}As$.

Figure 4A:
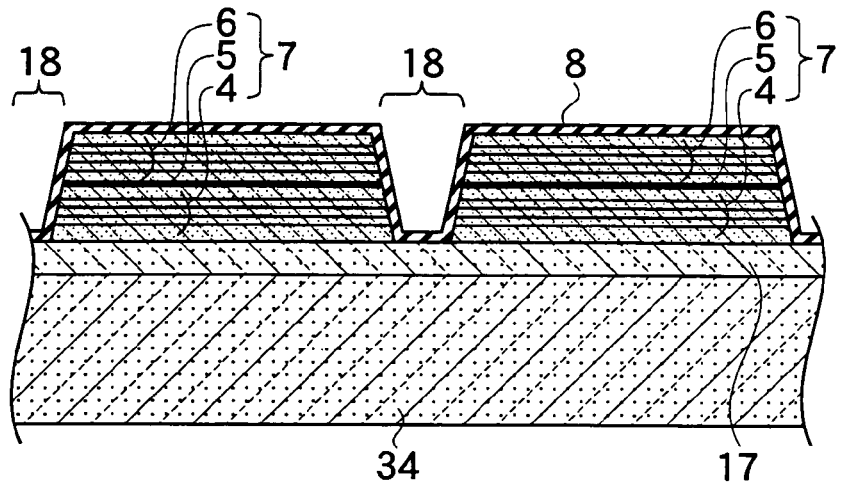
FIG. 4A is a schematic illustration of a step of a lift-off process according to the first embodiment, in which grooves are formed and a protective coating is coated.

First, the lift-off layer 17 are formed on the growth substrate 34 of GaAs and the epitaxial films 4, 5, 6 are further formed thereon. By means of etching, a plurality of grooves 18 each having a width of 10 µm, which are arranged in a grid-like arrangement having even intervals of 50 µm, are formed deep enough to reach the lift-off layer 17 so that the epitaxial films 4, 5, 6 are separated into a plurality of ELO segments 7. By means of such separation, the ELO segments 7 are formed into 40 µm squares and arranged in even intervals of 50 µm. In advance, a stopper layer of GaAs (thickness of which is, for example, 10 nm) may be put between the lift-off layer 17 and the n-type DBR 4. Thereby the etching is automatically stopped at a surface of the stopper layer, provided that etching method and etching material are appropriately selected. For example, dry etching such as reactive ion etching (RIE) can be achieved until just above the stopper layer of GaAs and wet etching with diluted hydrofluoric acid can be achieved so as to reach the stopper layer. The wet etching is automatically stopped. After separation of the ELO segments 7, a protective coating 8 of $SiO_2$ (having a thickness of 300 nm) is formed thereon as shown in FIG. 4A.

Figure 4B:
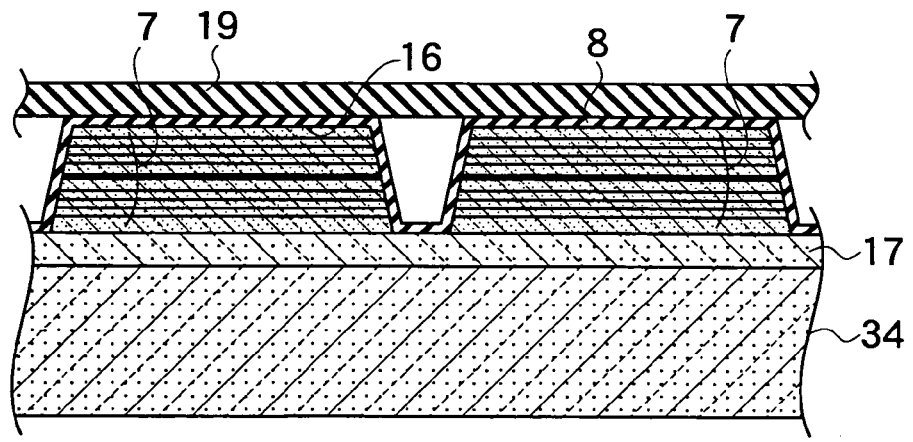
FIG. 4B is a schematic illustration of a step of the lift-off process according to the first embodiment, in which a tape is adhered to the protective coating.
Figure 4C:
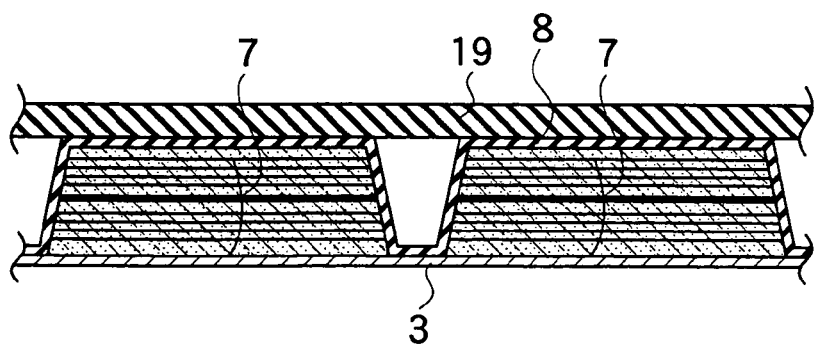
FIG. 4C is a schematic illustration of a step of the lift-off process according to the first embodiment, in which films are lift off from a film growth substrate and an electrode film is deposited.

Next, a transfer tape 19 is adhered on the protective coating 8 of $SiO_2$ as shown in FIG. 4B. As the transfer tape 19, a commonly used acid-resistant etching tape, a back surface of which can be ground, can be employed. The transfer tape 19 is preferably configured so that adhesion is decreased by means of ultraviolet irradiation for ease of peeling thereof. In this state, the lift-off layer 17 is selectively removed so that the growth substrate 34 of GaAs is exfoliated. As selective removal of the lift-off layer 17, selective etching of AlAs with hydrochloric acid can be available. Though $Al_xGa_{1-x}As(x>0.7)$, which has relatively high concentration of Al, is etched by the hydrochloric acid, $Al_xGa_{1-x}As(x=0.2)$, which has low concentration of Al, is not etched so much. Furthermore, GaAs is hardly etched. Therefore, in a case where the stopper layer of GaAs is formed, the ELO segments 7 are perfectly protected from the etching. According to this method, because the growth substrate 34 of GaAs is exfoliated without deterioration, the growth substrate 34 of GaAs can be reused for another epitaxial film growth. Alternatively, the etching with the hydrochloric acid can be achieved after polishing and removal of the growth substrate 34 of GaAs. According to the alternative, the exfoliation can be achieved in a shorter time. After the exfoliation, an n-contact 3 is deposited on exfoliated surfaces of the ELO segments 7 as shown in FIG. 4C. The n-contact 3 is formed by evaporation and deposition of AuGe including 10 atomic % of Ge by means of resistance heating so as to have a thickness of 250 nm.

Next, the ELO segments 7 are separated. The ELO segments 7 are connected with each other only via the protective coating 8 of $SiO_2$ and the n-contact 3. Therefore the ELO segments 7 are easily separated by a weak force. For applying the weak force, expanding method in which the transfer tape 19 is expanded is applied in view of productivity. Expanding the transfer tape 19 can be achieved by either straining or heating. Either can be applied. An expanding rate of the transfer tape 19 should be more than 100% and is preferably less than 500% so as to prevent giving large arrangement errors. More preferably, the expanding rate is in a range of from 200% to 400%.

Figure 5A:
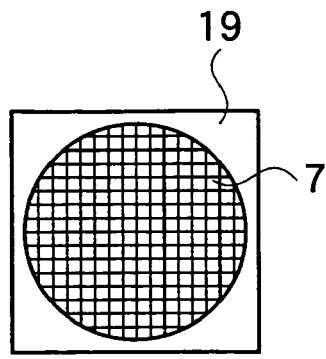
FIG. 5A is a schematic illustration of a plan view of lifted films adhered to the tape, just before separation.
Figure 5B:
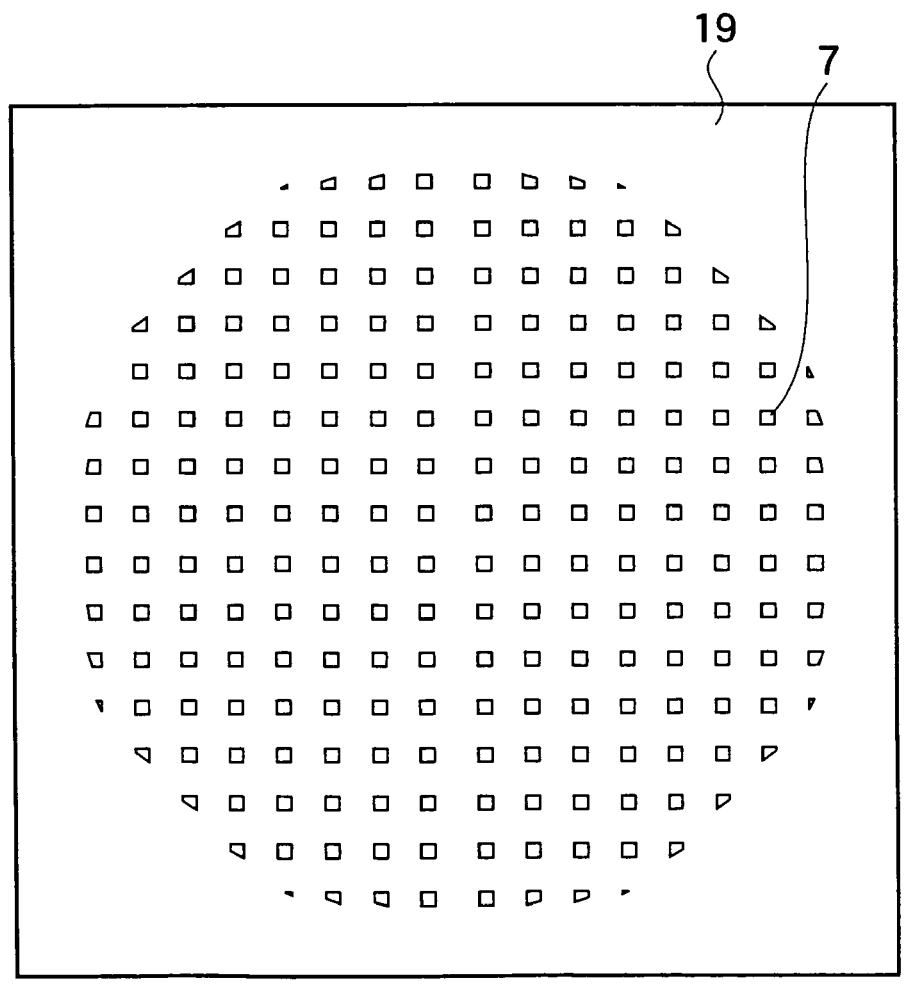
FIG. 5B is a schematic illustration of a plan view of the lifted films adhered to the tape, just after separation.
Figure 6A:
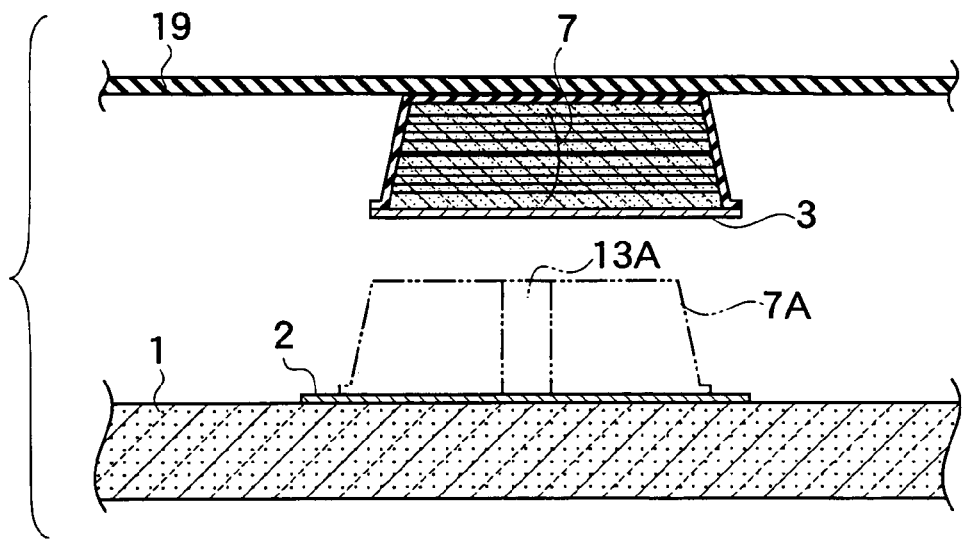
FIG. 6A is a schematic illustration of a step of the lift-off process according to the first embodiment, just before transferring the films to a substrate.
Figure 6B:
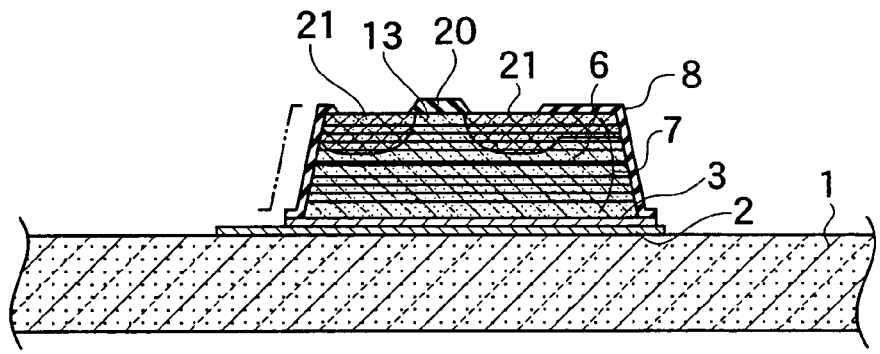
FIG. 6B is a schematic illustration of a step of the lift-off process according to the first embodiment, in which protons are implanted in the transferred films.

The ELO segments 7 as shown in FIG. 5A become separated and pitches therebetween become widened by means of expanding the transfer tape 19 as shown in FIG. 5B. The pitches between the separated ELO segments 7 may be in an order of 100 µm for example. After this, the ELO segments 7 are transferred to the objective substrate 1. As the objective substrate 1, either a ceramic substrate such as $Al_2O_3$ or an organic substrate such as an epoxy substrate with glass fiber cores can be employed. Furthermore, IC for driving the opto-electronic devices per se can be employed as the objective substrate 1. The objective substrate 1 may be configured to have patterns for direction of the ELO segments 7 as shown in FIG. 6A. Electrodes 2 of printed circuits can be applied to such patterns. The electrodes 2 may include margins required for tolerance of arrangement errors of the ELO segments 7 so that the transfer step can be easily examined. Chain double-dashed lines 7A and 13A in FIG. 6A respectively show ideal positions of the ELO segments 7 and the active regions 13. The ELO segments 7 are roughly directed by the patterns so as to be transferred to the objective substrate 1. Mounting of the ELO segments 7 on the objective substrate 1 can be achieved by means of pressure bonding, in which clean surfaces are bonded with each other by pressure, soldering or adhesion with conductive adhesive. Though the ELO segments 7 might be slightly deviated from the ideal position 7A as shown in FIG. 6B, confining active regions 13 (light emitting areas 13 in the present embodiment) can be accurately disposed as described later. The ELO segments 7 in a lump can be separated by means of such tape expansion method and transferred to the objective substrate 1 so that, for example, 50 μm pitches thereof become 150 μm pitches.

Next, confining light emitting areas 13 as VCSELs is achieved. An example by means of proton implantation will be described hereinafter. First, photolithography is achieved on the objective substrate 1 with the ELO segments 7 so that regions in the protective coating 8 subject to confining the light emitting areas 13 are exposed. For example, circular windows having a diameter of 25 μm are formed on a photoresist mask. When etching with $NH_4F$ aqueous solution is achieved, circles having a diameter of 25 μm on the respective light emitting areas 13 are removed from the protective coating 8 of $SiO_2$. Next, photolithography is further achieved so as to provide circular windows, where a diameter of 25 μm for example, on the respective light emitting areas 13. Gold is evaporated and deposited on the photoresist mask in a thickness of about 2 μm and the photoresist mask is removed with solvent. Then proton implantation masks 20 having proton implantation areas 21 therearound are respectively formed on the ELO segments 7 as shown in FIG. 6B. In this state, protons are implanted to the proton implantation areas 21, for example, with an acceleration voltage of 250 keV in a dose amount of $10^{15}$ $cm^{-2}$. Then light emitting areas 13 enclosed by the proton implantation areas 21 can be confined. Provided that a practical position of the ELO segment 7 is deviated from the ideal position 7A, the light emitting area 13 can be disposed at the ideal position 13A regardless of such deviation, according to the present embodiment.

Alternatively, confinement of the light emitting areas 13 can be achieved as follows. Thin film of AlAs or $Al_{0.95}Ga_{0.05}As$ is inserted in DBR in the vicinity of the active layer in advance. Mesa etching is achieved so as to expose side surfaces. Then water vapor oxidation at 350 degrees C. is achieved so as to leave light emitting areas 13 having a diameter of 25 μm.

Figure 6C:
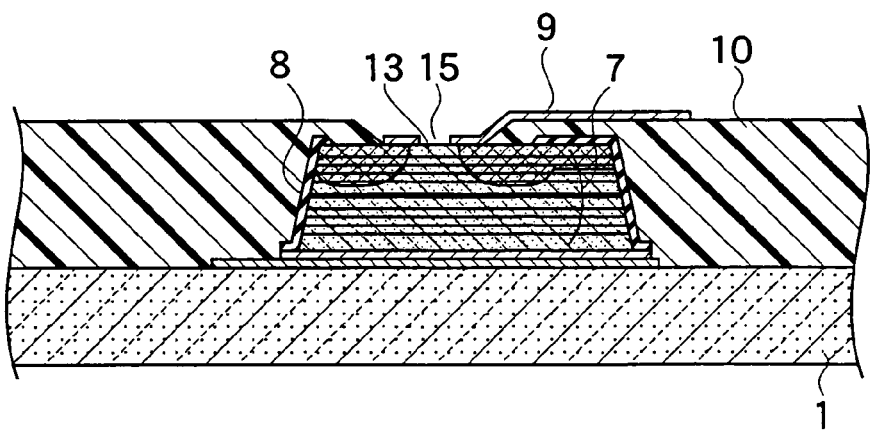
FIG. 6C is a schematic illustration of a step of the lift-off process according to the first embodiment, in which the transferred films are resin-molded and electrodes are formed.

Finally, a surface of the objective substrate 1 is molded in mold resin 10 (for example, polyimide resin) and portions thereof just above the light emitting areas 13 are selectively removed. Then p-contacts 9 are formed on the mold resin 10 so as to reach the respective ELO segments 7 as shown in FIG. 6C. As the p-contact 9, alloys of Au/Ti/Pt/Zn, Au/Cr and such can be employed. Openings having a diameter of 10 μm, which function as light emitting openings 15, are formed on the p-contacts 9. Alternatively, transparent electrode such as indium tin oxide (ITO) can be applied to the p-contact 9, thereby the light emitting openings 15 are self-aligned.

Figure 7:
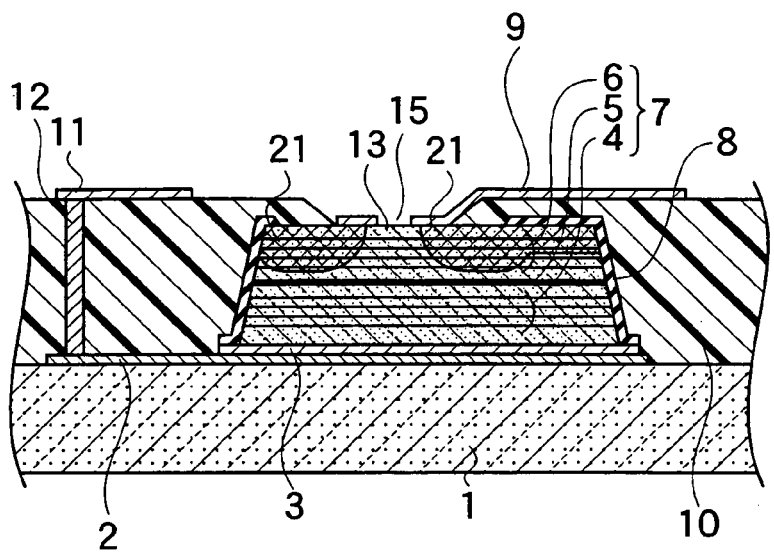
FIG. 7 is a schematic illustration of a side view of an example of an opto-electronic device array formed by the lift-off process according to the first embodiment.
Figure 8:
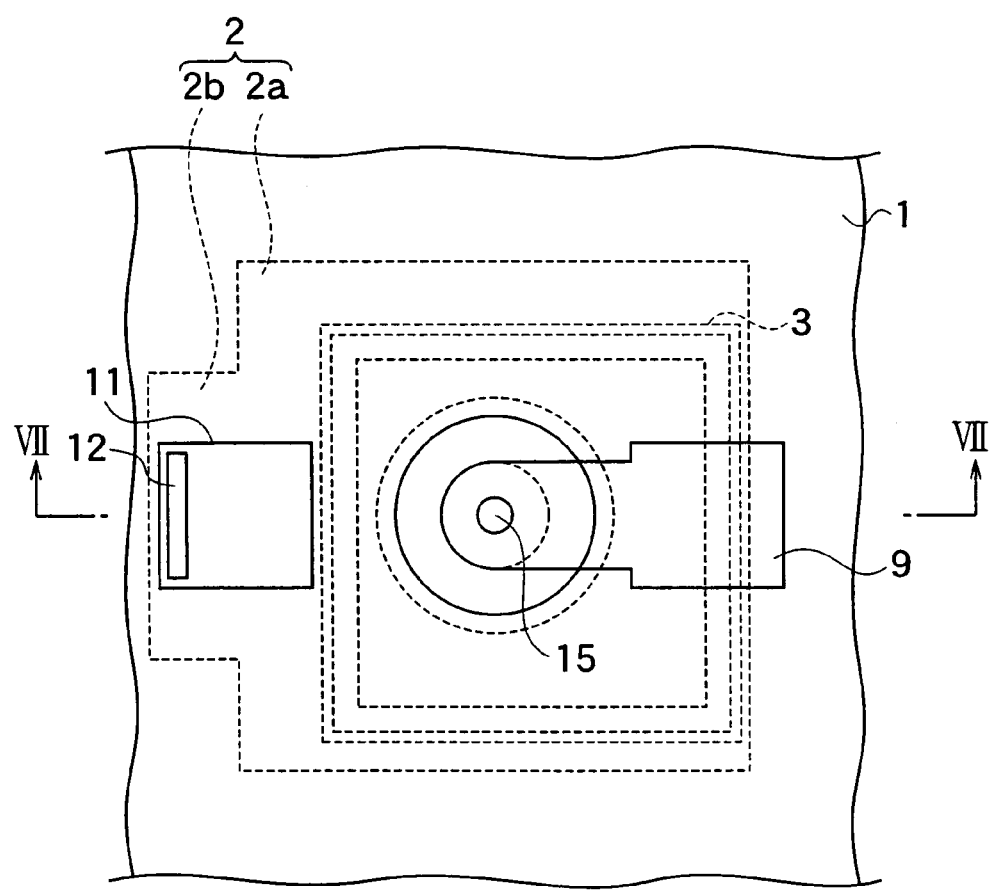
FIG. 8 is a schematic illustration of a plan view of the example of the opto-electronic device array formed by the lift-off process according to the first embodiment.

An example of thus produced VCSEL is shown in FIG. 7 and FIG. 8. A reference numeral 1 denotes an object substrate of $Al_2O_3$. A reference numeral 2 denotes a contact of Au/Cr. A reference numeral 12 denotes a via wiring metal of Au. A reference numeral 11 denotes an n-contact pad of Au/Cr. A reference numeral 9 denotes a p-contact of Au/Cr. The others are the same as the aforementioned constitution of FIGS. 4A–4C and FIGS. 6A–6C. In FIG. 8, the n-contact 3 corresponds to the position of the ELO segment 7. A rectangular portion 2a, which is a portion of the contact 2 other than a projected portion 2B for forming a contact, corresponds to an area for tolerance of an arrangement error of transferring the ELO segment 7. The light emitting opening 15 formed in the p-contact 9, which is formed in a circular shape and functions as a window for light emission, is disposed in a center of the rectangular portion 2a. Provided that the ELO segment 7 is transferred to a deviated position, the light emitting opening 15 is formed in the regular position.

A second embodiment of the present invention will be described hereinafter with reference to FIGS. 9A–14.

The production method of the aforementioned first embodiment was applied to the VCSELs, however, a production method of the second embodiment will be applied to light acceptance devices.

FIGS. 9A–9C and 10A–10C are sectional views showing production method of a PIN photo-diode array according to the second embodiment of the present invention. In the figures, a reference numeral 34 denotes a growth substrate of GaAs, a reference numeral 17 denotes a lift-off layer of AlAs (having a thickness of 2 μm), a reference numeral 33 denotes an n-type-$Al_{0.2}Ga_{0.8}As$ layer (having a thickness of 1 μm), a reference numeral 34 denotes a light absorption layer of non-doped GaAs (having a thickness of 3 μm) and a reference numeral 35 denotes a p-type-$Al_{0.2}Ga_{0.8}As$ layer (having a thickness of 0.5 μm).

Figure 9A:
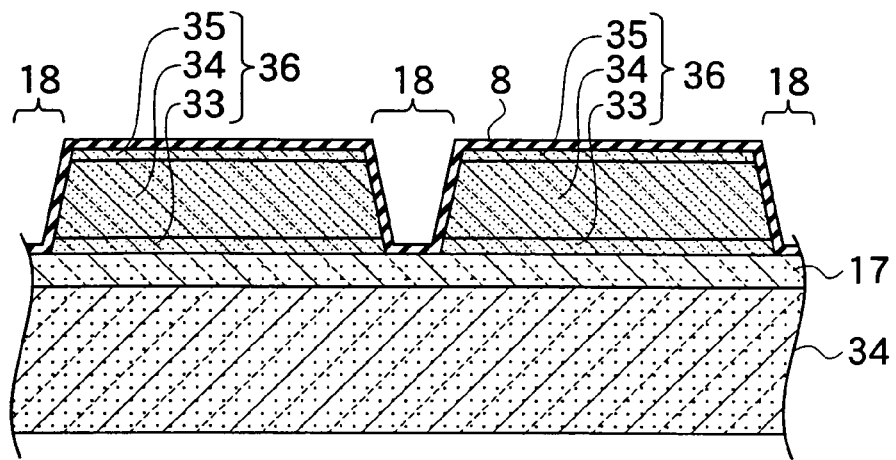
FIG. 9A is a schematic illustration of a step of a lift-off process according to a second embodiment of the present invention, in which grooves are formed and a protective coating is coated.

After growing the aforementioned layers, a plurality of grooves 18 each having a width of 10 μm, which are arranged in a grid-like arrangement having even intervals of 50 μm, are formed deep enough to reach the lift-off layer 17 so that the epitaxial films 33, 34, 35 are separated to form a plurality of ELO segments 36. By means of such separation, the ELO segments 36 are formed into 40 μm squares and arranged in even intervals of 50 μm. In advance, a stopper layer of GaAs (thickness of which is, for example, 10 nm) may be put between the lift-off layer 17 and the n-type-$Al_{0.2}Ga_{0.8}As$ layer 33. Thereby the etching is automatically stopped at a surface of the stopper layer, provided that etching method and etching material are appropriately selected. For example, dry etching such as reactive ion etching (RIE) can be achieved until just above the stopper layer of GaAs and wet etching with diluted hydrofluoric acid can be achieved so as to reach the stopper layer. The wet etching is automatically stopped. After separation of the ELO segments 7, a protective coating 8 of $SiO_2$ (having a thickness of 300 nm) is formed thereon as shown in FIG. 9A.

Figure 9B:
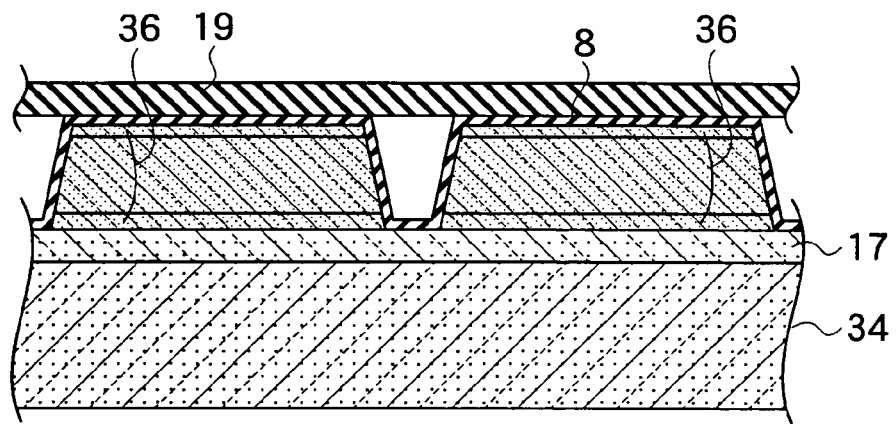
FIG. 9B is a schematic illustration of a step of the lift-off process according to the second embodiment, in which a tape is adhered to the protective coating.
Figure 9C:
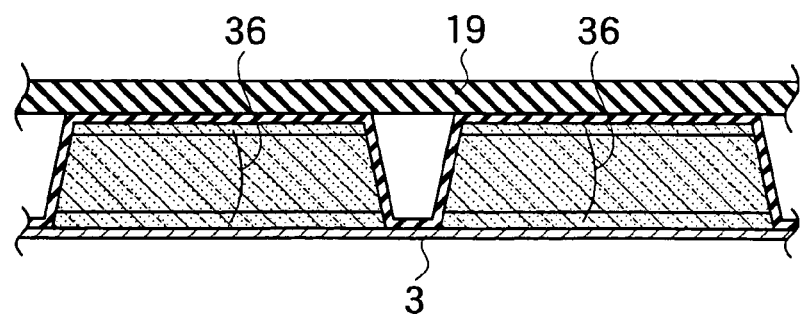
FIG. 9C is a schematic illustration of a step of the lift-off process according to the second embodiment, in which films are lift off from a film growth substrate and an electrode film is deposited.

Next, a transfer tape 19 is adhered on the protective coating 8 of $SiO_2$ as shown in FIG. 9B. As the transfer tape 19, a commonly used acid-resistant etching tape, a back surface of which can be ground, can be employed. The transfer tape 19 is preferably configured so that adhesion is decreased by means of ultraviolet irradiation for ease of peeling thereof. In this state, the lift-off layer 17 is selectively removed so that the growth substrate 34 of GaAs is exfoliated. As selective removal of the lift-off layer 17, selective etching of AlAs with hydrochloric acid can be available. Though $Al_xGa_{1-x}As(x>0.7)$, which has relatively high concentration of Al, is etched by the hydrochloric acid, $Al_xGa_{1-x}As$ (x=0.2), which has low concentration of Al, is not etched so much. Furthermore, GaAs is hardly etched. Therefore, in a case where the stopper layer of GaAs is formed, the ELO segments 7 are perfectly protected from the etching. According to this method, because the growth substrate 34 of GaAs is exfoliated without deterioration, the growth substrate 34 of GaAs can be reused for another epitaxial film growth. Alternatively, the etching with the hydrochloric acid can be achieved after polishing and removal of the growth substrate 34 of GaAs. According to the alternative, the exfoliation can be achieved in a shorter time. After the exfoliation, an n-contact 3 is deposited on exfoliated surfaces of the ELO segments 36 as shown in FIG. 9C. The n-contact 3 is formed by evaporation and deposition of AuGe including 10 atomic % of Ge by means of resistance heating so as to have a thickness of 250 nm.

Figure 10A:
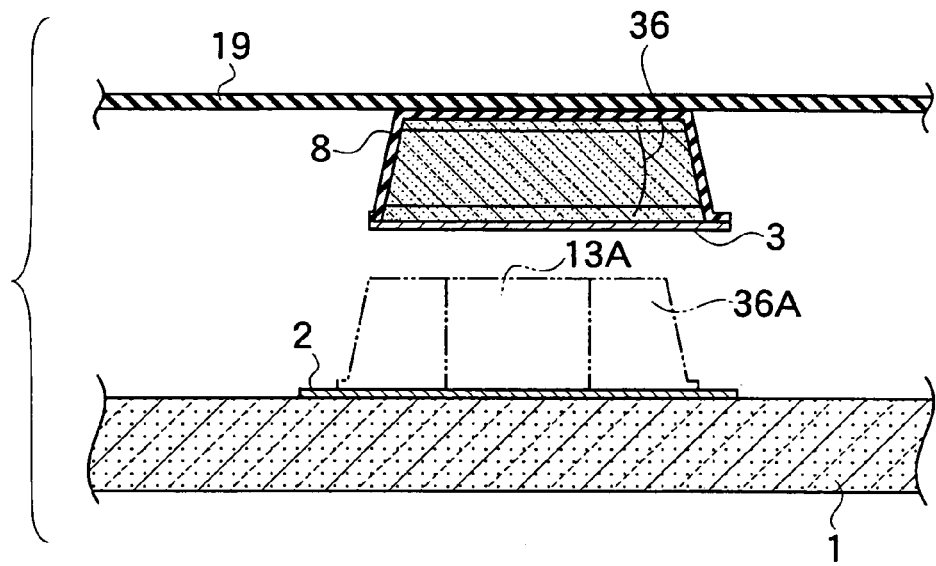
FIG. 10A is a schematic illustration of a step of the lift-off process according to the second embodiment, just before transferring the films to a substrate.
Figure 10B:
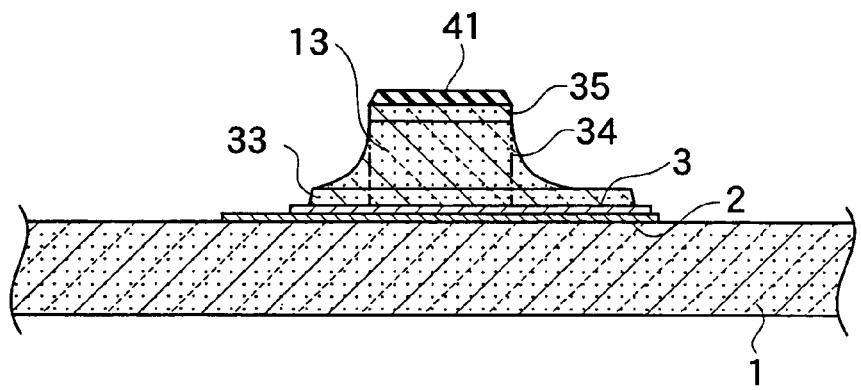
FIG. 10B is a schematic illustration of a step of the lift-off process according to the second embodiment, in which etching is achieved.

Next, the ELO segments 36 are separated. The ELO segments 7 are connected with each other only via the protective coating 8 of $SiO_2$ and the n-contact 3. Therefore the ELO segments 36 are easily separated by a weak force. For applying the weak force, expanding method in which the transfer tape 19 is expanded is applied in view of productivity. Expanding the transfer tape 19 can be achieved by either straining or heating. Either can be applied. The ELO segments 36 become separated and pitches therebetween become widened by means of expanding the transfer tape 19. The pitches between the separated ELO segments 36 may be in an order of 100 μm for example. After this, the ELO segments 36 are transferred to the objective substrate 1. As the objective substrate 1, either a ceramic substrate such as $Al_2O_3$ or an organic substrate such as an epoxy substrate with glass fiber cores can be employed. Furthermore, IC for driving the opto-electronic devices per se can be employed as the objective substrate 1. The objective substrate 1 may be configured to have patterns for direction of the ELO segments 36 as shown in FIG. 10A. Electrodes 2 of printed circuits can be applied to such patterns. The electrodes 2 may include margins required for tolerance of arrangement errors of the ELO segments 36 so that the transfer step can be easily examined. Chain double-dashed lines 36A and 13A in FIG. 10A respectively show ideal positions of the ELO segments 36 and the active regions 13. The ELO segments 36 are roughly directed by the patterns so as to be transferred to the objective substrate 1. Mounting of the ELO segments 36 on the objective substrate 1 can be achieved by means of pressure bonding, in which clean surfaces are bonded with each other by pressure, soldering or adhesion with conductive adhesive. Though the ELO segments 36 might be slightly deviated from the ideal position 36A as shown in FIG. 10B, confining active regions 13 (light acceptance areas 13 in the present embodiment) can be accurately disposed as described later. The ELO segments 36 in a lump can be separated by means of such tape expansion method and transferred to the objective substrate 1 so that, for example, 50 μm pitches thereof become 150 μm pitches.

Next, confining light acceptance areas 13 as PIN photo-diodes is achieved. An example by means of mesa etching, which is relatively simple, will be described hereinafter. First, photolithography is achieved on the objective substrate 1 with the ELO segments 36 so that the protective coating 8 on areas other than the light acceptance areas 13 is removed. For example, circular photoresist masks 41 having a diameter of 30 μm are formed on the respective ELO segments 36 and etching with $NH_4F$ aqueous solution is achieved. Alternatively, the circular photoresist masks 41 having a diameter of 30 μm may be directly formed on the ELO segments 36 without the protective coating 8. Next, mesa etching is achieved so as to confine the PIN photo-diode areas as shown in FIG. 10B. The mesa etching is achieved by means of a wet etching method with, for example, $H_2SO_4$, $H_2O_2$ and $H_2O$ mixture liquid (a mixing ratio thereof is 1:4:100) so as to reach the n-type-$Al_{0.2}Ga_{0.8}As$ layer 33. Then light acceptance areas 13 of the PIN photo-diodes can be confined.

Alternatively, confinement of the light acceptance areas 13 can be achieved as follows. An n-type-$Al_{0.2}Ga_{0.8}As$ layer instead of the p-type-$Al_{0.2}Ga_{0.8}As$ layer 35 is grown in advance. P-type impurity such as Zn is selectively diffused or implanted into the n-type-$Al_{0.2}Ga_{0.8}As$ layer so as to change a conduction type thereof into a p-type. In this alternative, the ELO segments 36 are subjected to a high temperature. Therefore forming contacts should be postponed. Mounting of the ELO segments 36 on the objective substrate 1 should be achieved by means of pressure bonding or such heat-resistant adhesion method.

Figure 10C:
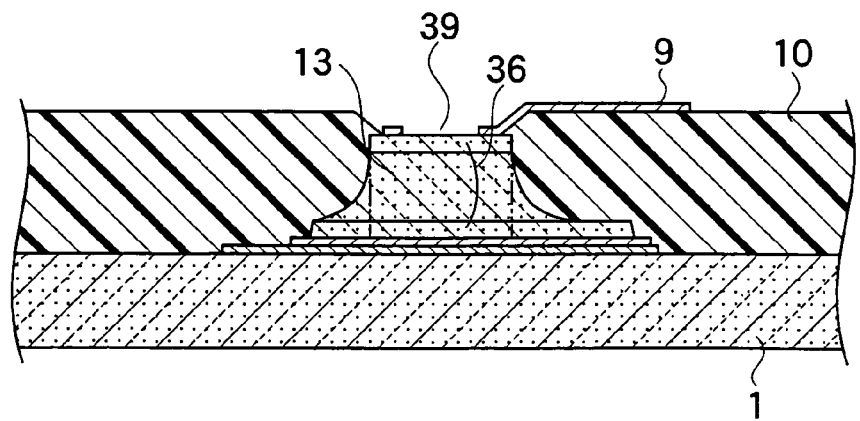
FIG. 10C is a schematic illustration of a step of the lift-off process according to the second embodiment, in which the transferred films are resin-molded and electrodes are formed.

Finally, a surface of the objective substrate 1 is molded in mold resin 10 (for example, polyimide resin) and portions thereof just above the light acceptance areas 13 are selectively removed. Then p-contacts 9 are formed on the mold resin 10 so as to reach the respective ELO segments 36 as shown in FIG. 10C. As the p-contact 9, alloys of Au/Ti/Pt/Zn, Au/Cr and such can be employed. Openings having a diameter of 20 μm, which function as light acceptance openings 39, are formed on the p-contacts 9. Alternatively, transparent electrode such as indium tin oxide (ITO) can be applied to the p-contact 9, thereby the light acceptance openings 39 are self-aligned.

Figure 11:
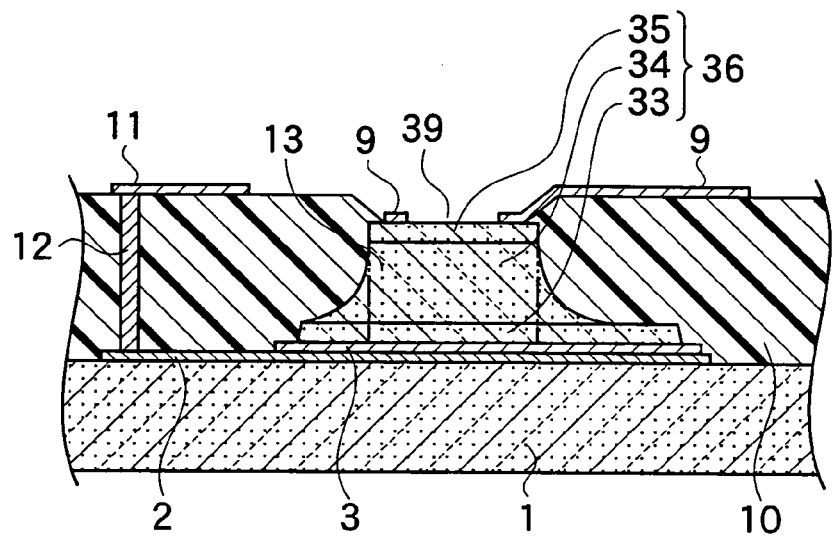
FIG. 11 is a schematic illustration of a side view of a first example of an opto-electronic device array formed by the lift-off process according to the second embodiment.
Figure 12:
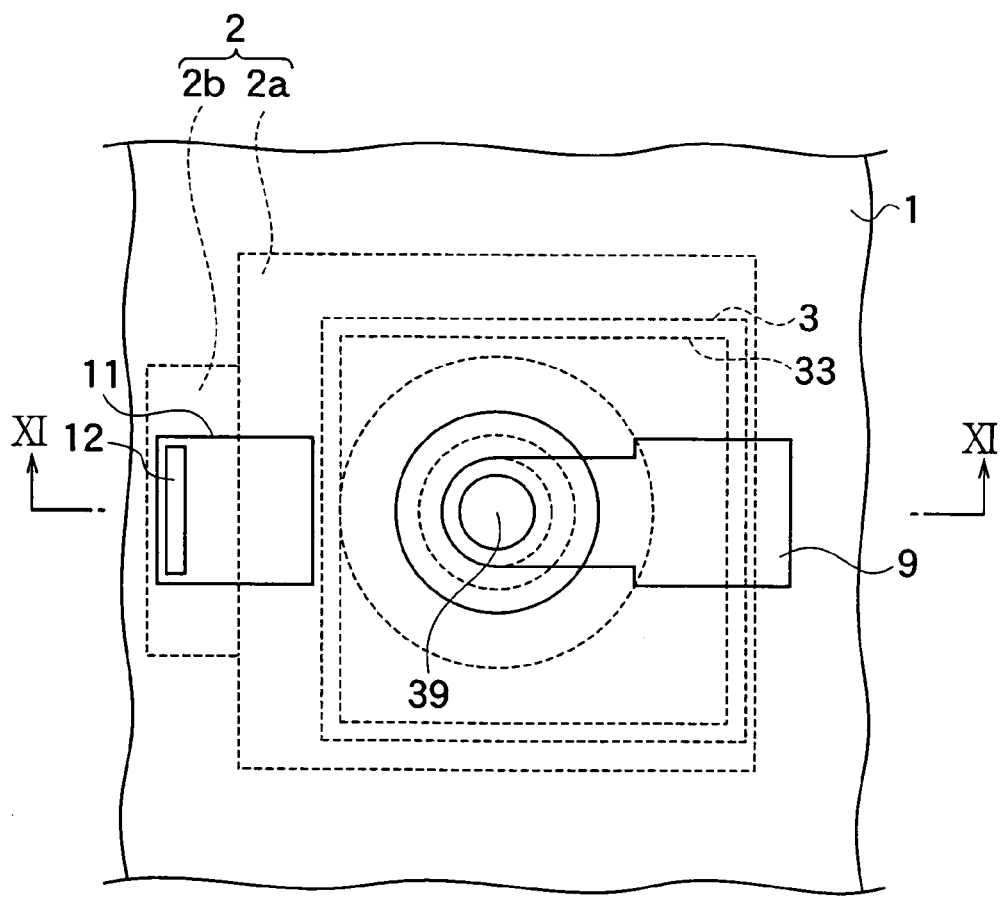
FIG. 12 is a schematic illustration of a plan view of the first example of the opto-electronic device array formed by the lift-off process according to the second embodiment.

An example of thus produced PIN photo-diode is shown in FIG. 11 and FIG. 12. A reference numeral 1 denotes an object substrate of $Al_2O_3$. A reference numeral 2 denotes a contact of Au/Cr. A reference numeral 12 denotes a via wiring metal of Au. A reference numeral 11 denotes an n-contact pad of Au/Cr. A reference numeral 9 denotes a p-contact of Au/Cr. The others are the same as the aforementioned constitution of FIGS. 10A–10C. In FIG. 12, the n-contact 3 corresponds to the position of the ELO segment 36. A rectangular portion 2a, which is a portion of the contact 2 other than a projected portion 2B for forming a contact, corresponds to an area for tolerance of an arrangement error of transferring the ELO segment 36. The light acceptance opening 39 formed in the p-contact 9, which is formed in a circular shape and functions as a window for light acceptance, is disposed in a center of the rectangular portion 2a. Provided that the ELO segment 36 is transferred to a deviated position, the light acceptance opening 39 is formed in the regular position.

Figure 13:
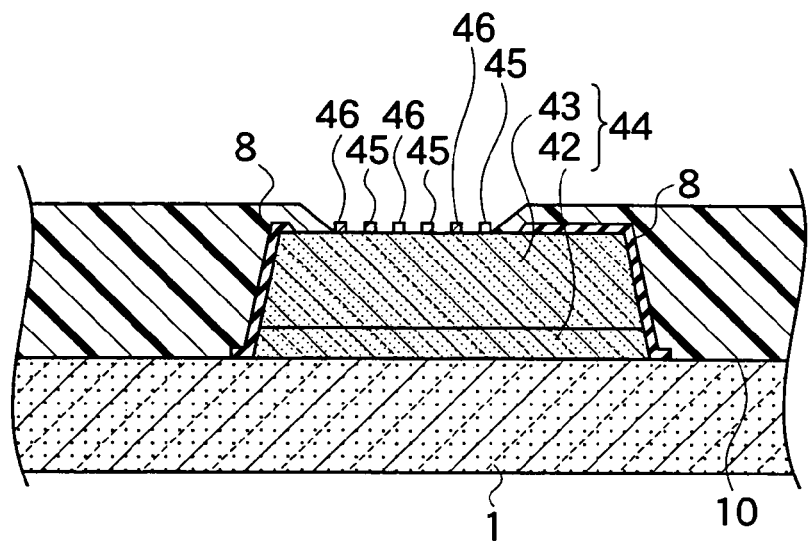
FIG. 13 is a schematic illustration of a side view of a second example of an opto-electronic device array formed by the lift-off process according to the second embodiment.
Figure 14:
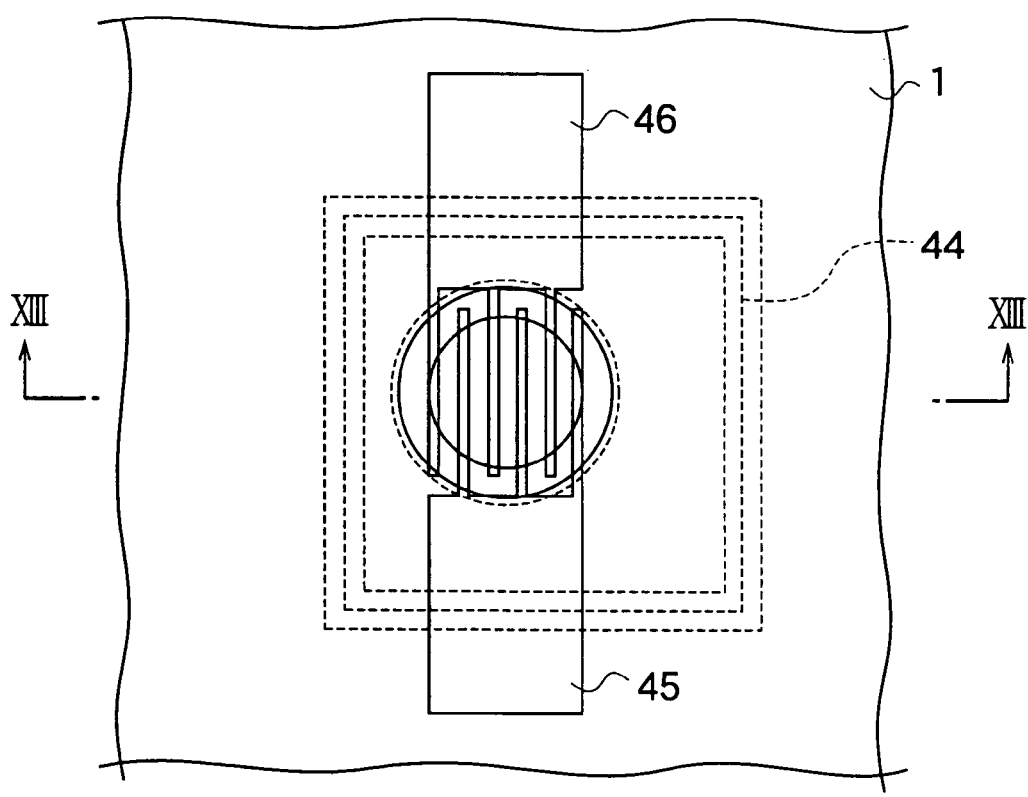
FIG. 14 is a schematic illustration of a plan view of the second example of the opto-electronic device array formed by the lift-off process according to the second embodiment.

The production methods of the aforementioned embodiments can be applied to another semiconductor device. An example of a metal-semiconductor-metal (MSM) photo-diode is shown in FIGS. 13 and 14. In FIG. 13, a reference numeral 1 denotes an object substrate of $Al_2O_3$, a reference numeral 42 denotes an n-type-$Al_{0.2}Ga_{0.8}As$ layer (having a thickness of 1 μm), a reference numeral 43 denotes a light absorption layer of non-doped GaAs (having a thickness of 3 μm), a reference numeral 8 denotes a protective layer of $SiO_2$, a reference numeral 10 denotes a mold resin of polyimide, reference numerals 45 and 46 respectively denote first and second Schottky contacts of Au/Al. The production method of the aforementioned second embodiment can be generally applied to this structure, however, light acceptance areas are confined by the first and second contacts 45 and 46, which are formed in comb shapes and overlap each other as shown in FIG. 14. Furthermore, the contact 2, the n-contact 3 and the via wiring metal 12 are omitted. Bonding ELO segments 44 on the objective substrate 1 can be achieved by mean of any of the aforementioned method. Similar to the aforementioned examples, the objective substrate 1 may be configured to have patterns for direction of the ELO segments 44. The ELO segments 44 are roughly directed by the patterns so as to be transferred to the objective substrate 1. The patterns may include margins so that arrangement errors of the ELO segments 44 can be tolerated and the MSM photo-diodes can be formed in accurate positions.

A tape expansion method is described above. However, an expanding rate of commonly used tapes is generally in a range from 200% to 400%. Therefore extremely large expanded pitches between the ELO segments could hardly be given according to the tape expansion method. Off course, there is a commercially available tape which has an expanding rate larger than 500%. However, an extremely large expansion might give large arrangement errors of the ELO segments. Therefore, another method is preferable in a case where the expanding rate needs to be larger than 400%. A method described hereinafter can be applied to such a case.

A third embodiment of the present invention will be described hereinafter with reference to FIGS. 15–17B.

Figure 15:
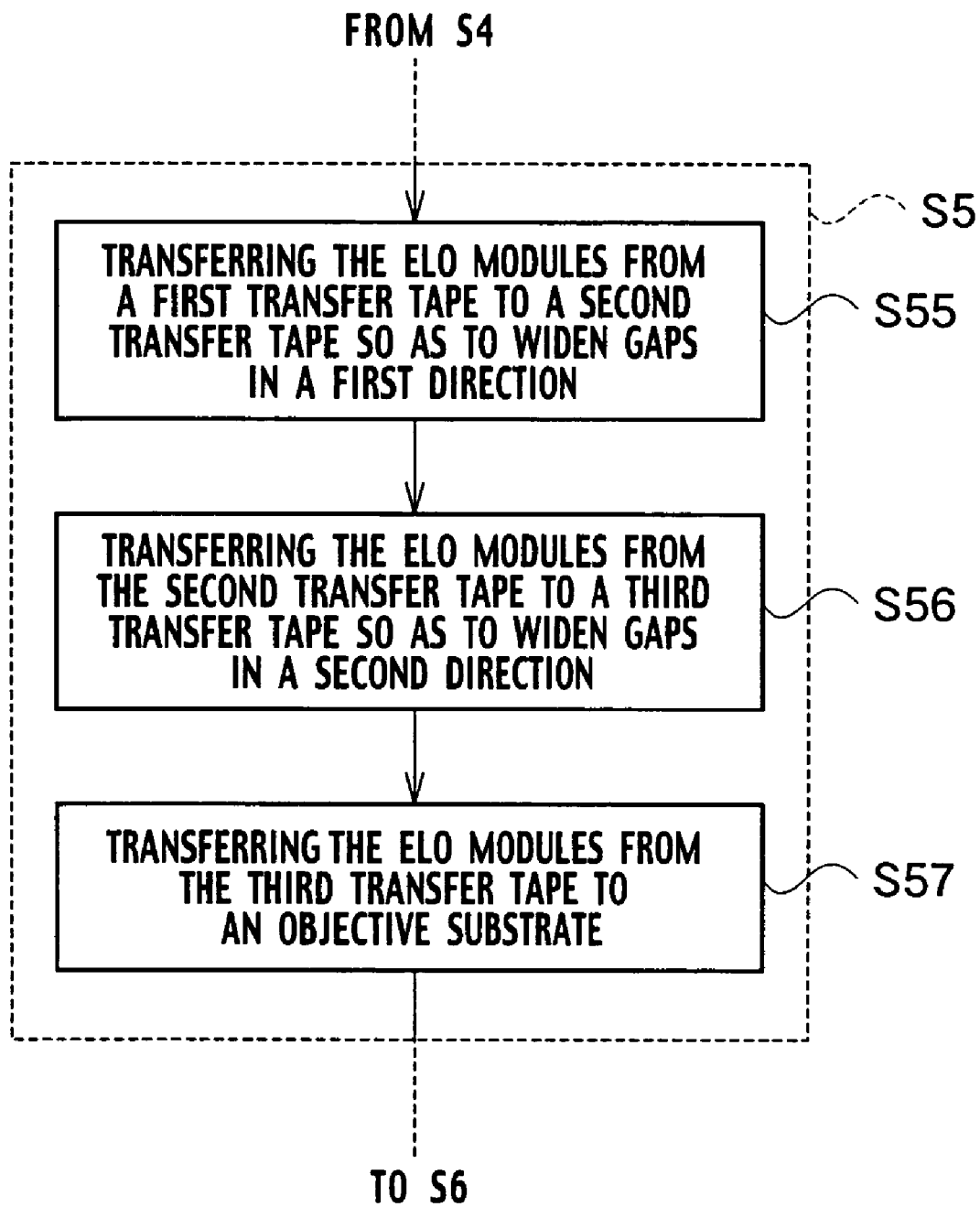
FIG. 15 is a flow chart of the S5 step modified in accordance with a third embodiment of the present invention.

Compared with the aforementioned embodiments, the third embodiment is generally characterized in that the step S5 is modified into steps S55, S56 and S57 as shown in FIG. 15. Steps can be similarly achieved until exfoliation of the ELO segments 7. After separation and exfoliation of the ELO segments 7, pitches between the ELO segments 7 are widened through two steps S55 and S56. In the third embodiment, first, second and third transfer tapes 25, 26 and 30 are employed, any of which is preferably configured so that adhesion is decreased by means of ultraviolet (UV) irradiation for ease of peeling thereof.

Figure 16A:
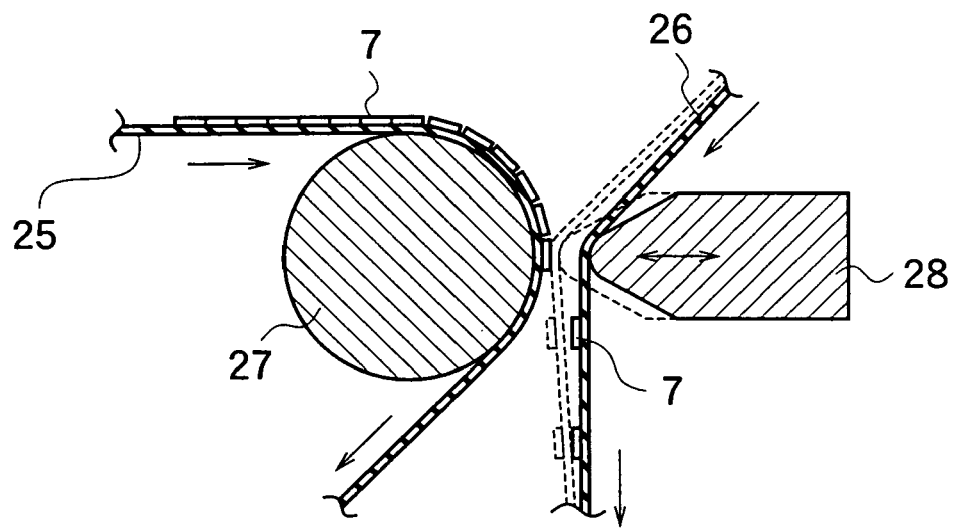
FIG. 16A is a schematic illustration of a step of the lift-off process according to the third embodiment, in which lifted films are transferred from a first tape to a second tape.
Figure 16B:
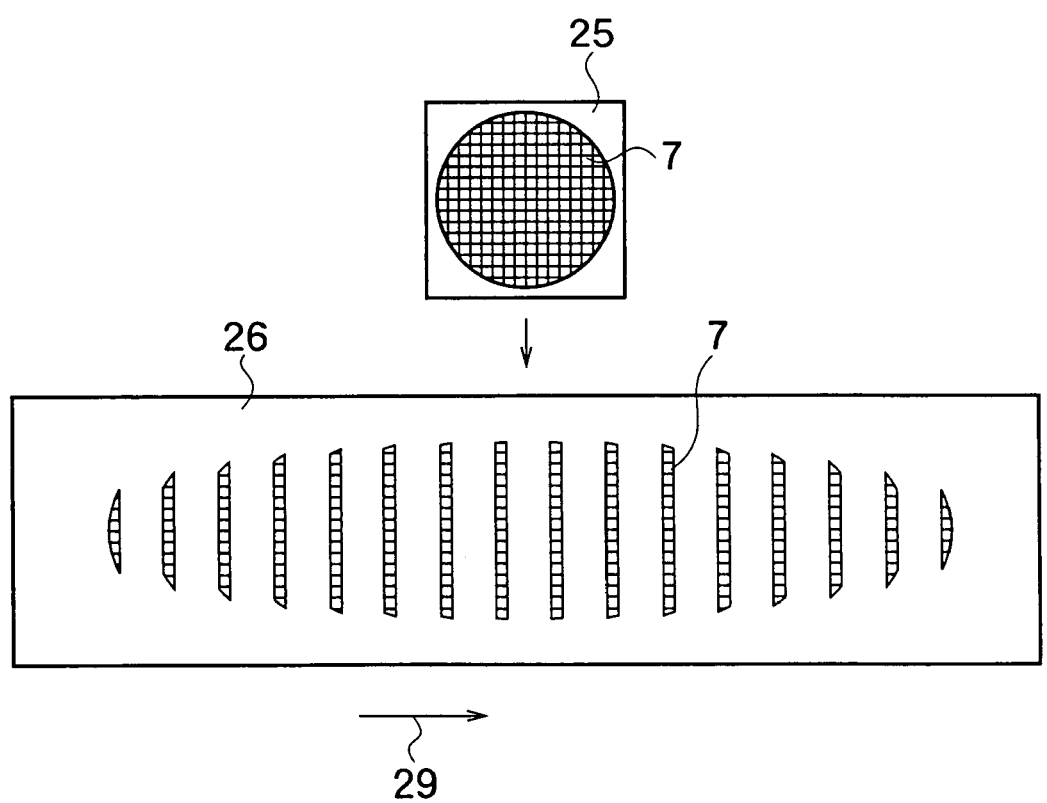
FIG. 16B is a schematic illustration of widening pitches of the lifted films separated by the step shown in FIG. 16A.

At the step S55, the first transfer tape 25 adhering the ELO segments 7 is irradiated by UV light at an intensity of 1000 mJ/cm$^2$ and subsequently reeled by a roller 27. The second transfer tape 26 is opposed to the first transfer tape 25 and slidably supported by a cylinder 28 from a back surface thereof as shown in FIG. 16A. The positions of the ELO segments 7 are steadily detected by a sensor (not shown). When one row of the ELO segments 7 reaches a predetermined position, the roller 27 and the first transfer tape 25 are stopped. Then the cylinder 28 presses the second transfer tape 26 toward the first transfer tape 25 so that the row of the ELO segments 7 are transferred to the second transfer tape 26. Subsequently the first transfer tape 25 is reeled so as to reach the predetermined position. At the same time, the second transfer tape 26 is moved in a predetermined length which corresponds to an intended pitch of the ELO segments 7. When a next row of the ELO segments 7 reaches the predetermined position, the roller 27 and the first transfer tape 25 are stopped and the cylinder 28 pressed the second transfer tape 26. Subsequently such procedures are repeated, thereby all of the ELO segments 7 are transferred to the second transfer tape 26 and the pitches therebetween are widened into the intended pitches in a first direction 29, which is parallel to movement of the second transfer tape 26, as shown in FIG. 16B.

In the aforementioned description, UV irradiation is achieved before the first transfer tape 25 is reeled by the roller 27 so as to decrease adhesion thereof. However, there is concern about displacement of the ELO segments 7 from the first transfer tape 25 in a case where the adhesion is overly decreased. To avoid such displacement, UV irradiation unit may be installed inside of the roller 27 so that the UV irradiation is achieved in the site of transferring.

Figure 17A:
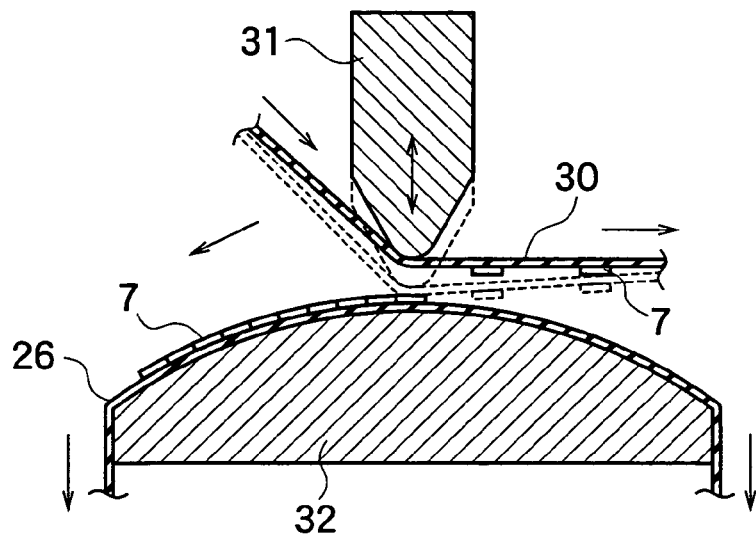
FIG. 17A is a schematic illustration of a step of the lift-off process according to the third embodiment, in which lifted films are transferred from the second tape to a third tape.
Figure 17B:
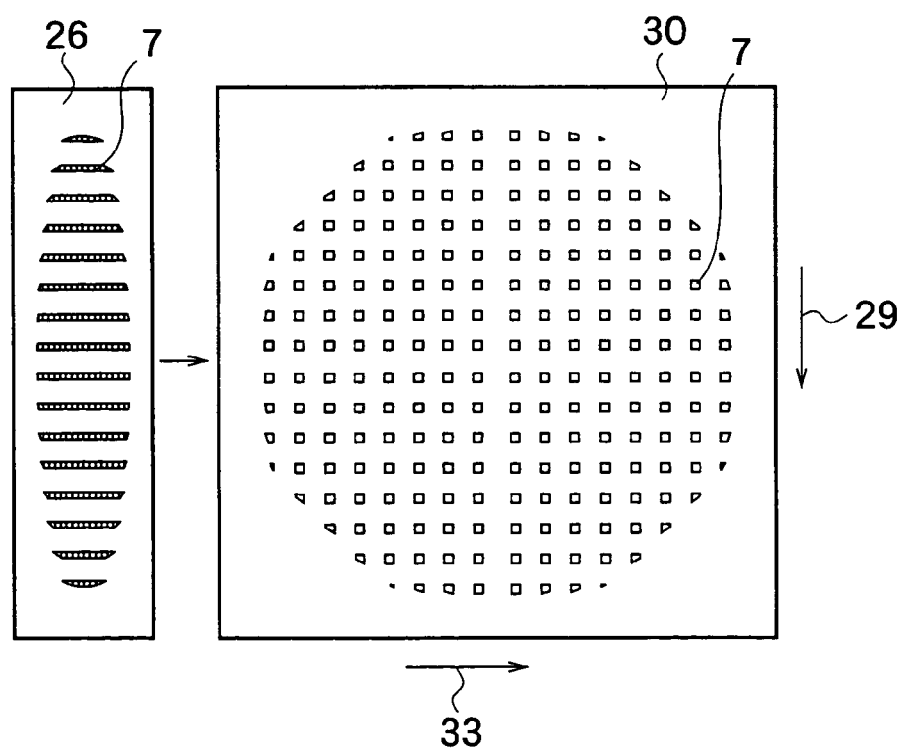
FIG. 17B is a schematic illustration of separation of the lifted films separated by the step shown in FIG. 17A.

Next, at the step S56, the second transfer tape 26 with the ELO segments 7 are attached on a jig 32, which has a cylindrical surface, as shown in FIG. 17A. Then the second transfer tape 26 is directed so that the first direction 29 is parallel to a cylindrical axis of the jig 32 and slightly tensed so as to closely contact with the jig 32. The second transfer tape 26 is irradiated by UV light from a back surface thereof so that adhesion thereof is decreased. The third transfer tape 30 is opposed to the second transfer tape 26 and slidably supported by a cylinder 31 from a back surface thereof. The cylinder 31 with the third transfer tape 30 is moved to one row of the ELO segments 7, the positions of which are steadily detected by a sensor (not shown). When the cylinder 31 reaches to a position corresponding to one row of the ELO segments 7, the cylinder 31 presses the third transfer tape 30 so that the row of the ELO segments 7 are transferred to the third transfer tape 30. Subsequently the third transfer tape 30 is moved in a predetermined length which corresponds to an intended pitch of the ELO segments 7. When the cylinder 31 reaches to a position corresponding to a next row of the ELO segments 7, the cylinder 31 pressed the third transfer tape 30. Subsequently such procedures are repeated, thereby all of the ELO segments 7 are transferred to the third transfer tape 30 and the pitches therebetween are widened into the intended pitches in a second direction 33, which is orthogonal to the first direction 29, as shown in FIG. 17B.

As described above, the pitches between the ELO segments 7 can be widened without being restricted by the expanding rate of the transfer tape as well as accurate pitches can be obtained. The aforementioned method may give a very large widening rate reaching 1000%. For example, a pitch of 25 μm can be widened to be a pitch of 250 μm. It contributes to decrease of production cost.

The present invention is not limited to the aforementioned embodiments. For example, the present invention can be applied to cases of any of the light emitting devices such as edge emitting semiconductor lasers and light emitting diodes as well as the aforementioned VCSEL, any of the light acceptance devices such as edge acceptance devices and avalanche photo diodes (APD), and optical modulation devices. Furthermore, the present invention can be applied to light emitting-acceptance devices, each of which includes both a light emitting region and a light acceptance region. The aforementioned devices for transfer segments and widening pitches therebetween are described as only examples. Any devices and method can be applied, for example, the related art disclosed in Japanese Patent Application Laid-open No. H11-307878 may be applied.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A method for making an array of opto-electronic devices from a multilayer epitaxial film, comprising:
    separating the multilayer epitaxial film into a plurality of segments;
    transferring the segments to a first substrate; and
    confining active regions in the respective segments on the first substrate so that the active regions form the array, wherein:
    the confining includes implanting ion into the respective segments so as to enclose the active regions.

2. The method of claim 1, further comprising:
    forming a lift-off layer on a second substrate; and
    growing the multilayer epitaxial film on the lift-off layer, wherein the separating comprises forming grooves on the multilayer epitaxial film so as to reach the lift-off layer and removing the lift-off layer whereby the epitaxial film is separated into the segments.

3. The method of claim 1, wherein:
    a dose of the ions is not less than $10^{-15}$ cm$^{-2}$.

4. A method of making an array of opto-electronic devices from a multilayer epitaxial film, comprising:
    separating the multilayer epitaxial film into a plurality of segments;
    transferring the segments to a first substrate; and
    confining active regions in the respective segments on the first substrate so that the active regions form the array, wherein:
    the confining includes etching areas other than the active regions in the respective segments.

5. The method of claim 4, further comprising:
    forming a lift-off layer on a second substrate; and growing the multilayer epitaxial film on the lift-off layer, wherein the separating comprises forming grooves on the multilayer epitaxial film so as to reach the lift-off layer and removing the lift-off layer whereby the epitaxial film is separated into the segments.

6. A method for making an array of opto-electronic devices from a multilayer epitaxial film, comprising:
separating the multilayer epitaxial film into a plurality of segments;
transferring the segments into a first substrate; and
confining active regions in the respective segments on the first substrate so that the active regions form the array, wherein:
the confining includes depositing contacts on the respective segments.

7. The method of claim 6, further comprising:
forming a lift-off layer on a second substrate; and
growing the multilayer epitaxial film on the lift-off layer, wherein the separating comprises forming grooves on the multilayer epitaxial film so as to reach the lift-off layer and removing the lift-off layer whereby the epitaxial film is separated into the segments.

8. A method for making an array of opto-electronic devices from a multilayer epitaxial film, comprising:
separating the multilayer epitaxial film into a plurality of segments;
adhering the plurality of segments on a tape; and
extending the tape so as to widen pitches between the segments on the tape;
transferring the segments to a first substrate; and
confining active regions in the respective segments on the first substrate so that the active regions form the array.

9. The method of claim 8, wherein an expanding rate of the tape is in a range of from 100% to 500%.

10. A method for making an array of opto-electronic devices from a multilayer epitaxial film, comprising:
separating the multilayer epitaxial film into a plurality of segments;
adhering the plurality of segments on a first tape;
extending the first tape so as to widen pitches between the segments on the first tape in a first direction;
transferring the segments from the first tape to a second tape; and
extending the second tape so as to widen pitches between the segments on the second tape in a second direction;
transferring the segments to a first substrate; and
confining active regions in the respective segments on the first substrate so that the active regions form the array.

11. A method for making an array of opto-electronic devices from a multilayer epitaxial film, comprising:
separating the multilayer epitaxial film into a plurality of segments;
transferring the segments to a first substrate; and
implanting ions into the respective segments on the first substrate so as to confine active regions enclosed in areas to which the ions are implanted so that the active regions form the array.

12. The method of claim 11, further comprising:
forming a lift-off layer on a second substrate; and
growing the multilayer epitaxial film on the lift-off layer, wherein the separating step comprises forming grooves on the multilayer epitaxial film so as to reach the lift-off layer and removing the lift-off layer whereby the epitaxial film is separated into the segments.

13. The method of claim 11, wherein:
a dose of the ions is not less than $10^{-15}$ cm$^{-2}$.

14. The method of claim 11, further comprising:
adhering the multilayer epitaxial film on a tape; and
extending the tape so as to widen pitches between the segments on the tape.

15. The method of claim 14, wherein an expanding rate of the tape is in a range of from 100% to 500%.

16. The method of claim 11, further comprising:
adhering the multilayer epitaxial film on a first tape;
extending the first tape so as to widen pitches between the segments on the tape in a first direction;
transferring the segments from the first tape to a second tape; and
extending the second tape so as to widen pitches between the segments on the tape in a second direction.

17. A method for making an array of opto-electronic devices from a multilayer epitaxial film, comprising:
separating the multilayer epitaxial film into a plurality of segments;
transferring the segments to a first substrate; and
confining active regions in the respective segments on the first substrate so that the active regions form the array.

18. The method of claim 17, further comprising:
forming a lift-off layer on a second substrate; and
growing the multilayer epitaxial film on the lift-off layer, wherein the separating comprises forming grooves on the multilayer epitaxial film so as to reach the lift-off layer and removing the lift-off layer whereby the epitaxial film is separated into the segments.

19. The method of claim 17, further comprising:
adhering the multilayer epitaxial film on a tape; and
extending the tape so as to widen pitches between the segments on the tape.

20. The method of claim 19, wherein an expanding rate of the tape is in a range of from 100% to 500%.

21. The method of claim 17, further comprising:
adhering the multilayer epitaxial film on a first tape;
extending the first tape so as to widen pitches between the segments on the tape in a first direction;
transferring the segments from the first tape to a second tape; and
extending the second tape so as to widen pitches between the segments on the tape in a second direction.

22. A method for making an array of opto-electronic devices from a multilayer epitaxial film, comprising:
separating the multilayer epitaxial film into a plurality of segments at a first pitch;
extending the first pitch to the second pitch which is wider than the first pitch;
transferring the segments to a first substrate at the second pitch; and
confining active regions in the respective segments on the first substrate so that the active regions form the array, after transferring the segments.

23. The method of claim 22, further comprising:
forming a lift-off layer on a second substrate; and
growing the multilayer epitaxial film on the lift-off layer, wherein the separating comprises forming grooves on the multilayer epitaxial film so as to reach the lift-off layer and removing the lift-off layer whereby the epitaxial film is separated into the segments.

24. The method of claim 22, wherein:
the confining further comprises;
implanting ion into the respective segments so as to enclose the active regions.

25. The method of claim 24, wherein:
a dose of the ions is not less than $10^{-15}$ cm$^{-2}$.

26. The method of claim 22, wherein:
the confining further comprises;
etching areas other than the active regions in the respective segments.

27. The method of claim 22, wherein:
the confining further comprises;
depositing contacts on the respective segments.

28. The method of claim 22, wherein:
the extending includes adhering the plurality of segments on a first tape, and expanding the tape so as to widen pitches between the segments on the tape.

29. The method of claim 28, wherein an expanding rate of the tape is in a range of from 100% to 500%.

30. The method of claim 22, wherein:
the extending includes adhering the plurality of segments on a first tape, expanding, the first tape so as to widen pitches between the segments on the first tape in a first direction, transferring the segments from the first tape to a second tam and expanding the second tape in a second direction.

* * * * *